United States Patent [19]

Leveque et al.

[11] Patent Number: 4,944,908
[45] Date of Patent: Jul. 31, 1990

[54] METHOD FOR FORMING A MOLDED PLASTIC ARTICLE

[75] Inventors: Denis J. Leveque, Milwaukee; Neil A. Czarnecki, Mukwonago, both of Wis.

[73] Assignee: Eaton Corporation, Cleveland, Ohio

[21] Appl. No.: 264,115

[22] Filed: Oct. 28, 1988

[51] Int. Cl.$^5$ ............................................. B29C 45/14
[52] U.S. Cl. ..................................... 264/232; 264/511;
264/132; 264/135; 264/233; 264/255; 264/265;
264/266; 264/272.15; 264/272.17; 264/278;
29/620; 29/848; 156/656; 156/150; 156/902
[58] Field of Search ............... 264/132, 134, 135, 241,
264/263, 265, 272.17, 511, 266, 255, 232, 233,
272.15, 278; 29/620, 648, 849; 156/150, 298,
655, 656, 659.1, 901, 902

[56] References Cited

U.S. PATENT DOCUMENTS

| | | |
|---|---|---|
| 634,523 | 10/1890 | Epp . |
| 2,447,541 | 8/1948 | Sabee et al. ............................ 154/94 |
| 2,692,190 | 10/1954 | Pritikin ................................. 41/42 |
| 2,724,674 | 11/1955 | Pritikin ................................. 154/95 |
| 2,874,085 | 2/1959 | Brietzke ................................ 154/94 |
| 3,181,986 | 5/1965 | Pritikin ................................ 156/233 |
| 3,282,755 | 11/1966 | Tischler ................................ 156/3 |
| 3,706,100 | 12/1972 | Halbeck et al. ....................... 317/58 |
| 3,889,363 | 6/1975 | Davis ................................ 264/255 X |
| 3,956,041 | 5/1976 | Polichette et al. ...................... 156/3 |
| 4,329,779 | 5/1982 | England ................................ 29/840 |
| 4,415,607 | 11/1983 | Denes et al. ........................... 427/96 |
| 4,705,983 | 11/1987 | Franz et al. ......................... 310/89 X |

FOREIGN PATENT DOCUMENTS 256620 4/1986 Japan .................................. 264/259

OTHER PUBLICATIONS

"In-Mold Decal Process Adapted to Molded Circuit Boards", Technology Newsfocus, Plastics Technology, Dec. 1988, p. 13.

*Primary Examiner*—Jan H. Silbaugh
*Assistant Examiner*—Christopher A. Fiorilla
*Attorney, Agent, or Firm*—L. G. Vande Zande

[57] ABSTRACT

A printed circuit is formed by conventional methods over an adhesive coating applied to a flexible high temperature withstandability disposable backing to form a flexible laminate which is positioned in a cavity of an injection mold to conform to surface variations. The printed circuit conductors are surrounded on three sides by molten plastic material injected into the mold cavity to embed the conductors in the respective surfaces of the molded plastic article, which surfaces are non-coplanar and adjoining and the conductors are continuous from one surface to the other. The bond strength of the adhesive is preferably high with regard to the backing and low with regard to the printed circuit conductors to permit adhesive and backing to be peeled away after molding, thereby providing a three diemensional printed circuit in, for example, a recessed area of a molded plastic housing part of electrical apparatus.

5 Claims, 3 Drawing Sheets

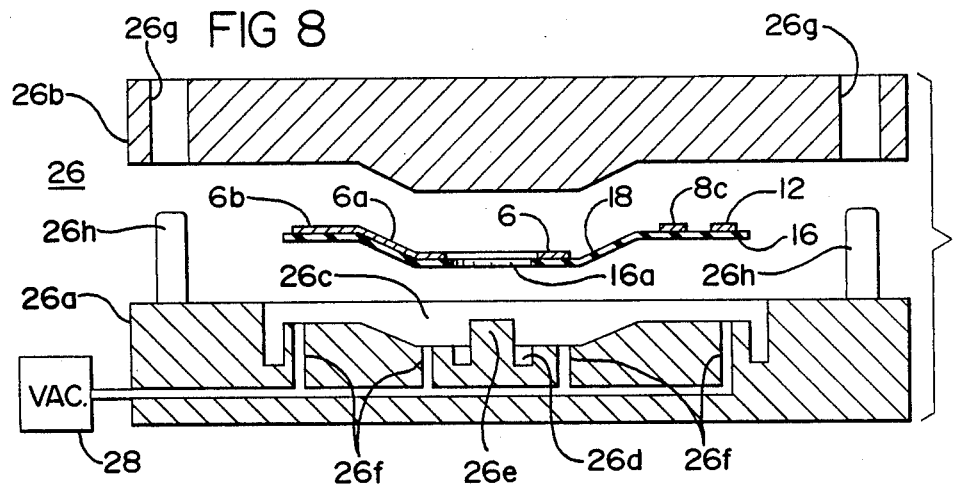
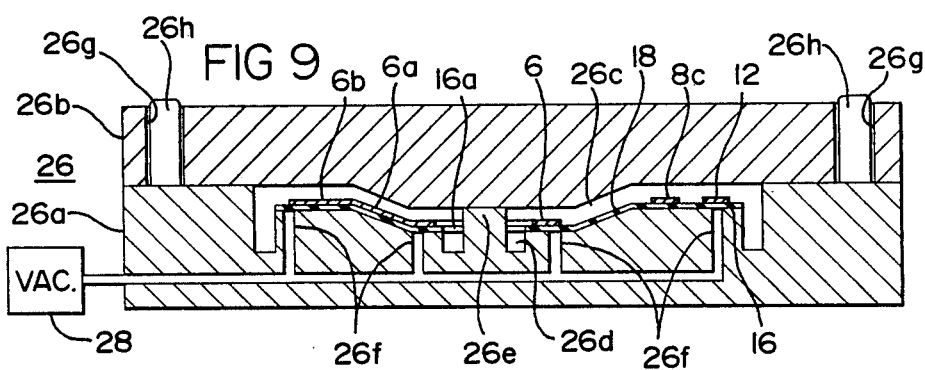
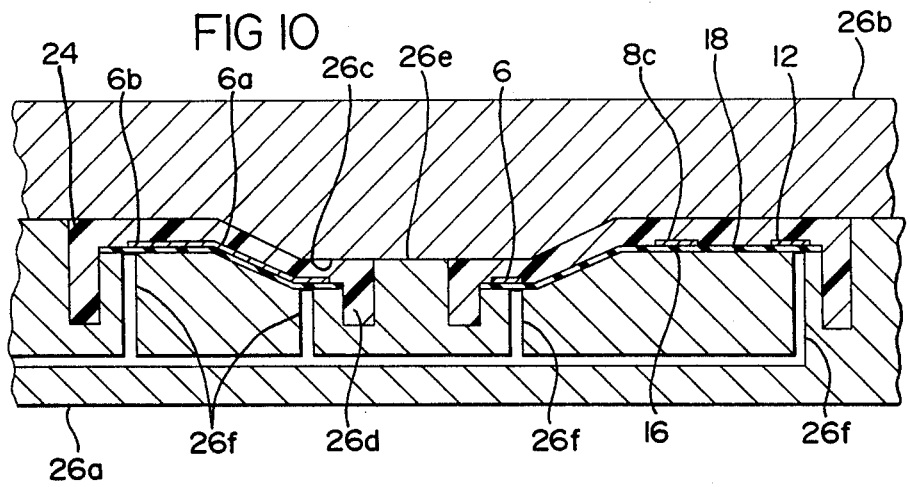

METHOD FOR FORMING A MOLDED PLASTIC ARTICLE

BACKGROUND OF THE INVENTION

This invention relates to embedding a printed circuit in a recessed surface of a molded plastic article. More specifically, the invention relates to embedding a printed circuit in adjoining non-coplanar recessed surfaces of a molded plastic article wherein the printed circuit is continuous from one adjoining surface to the other.

It is well known to deposit a printed circuit on an insulating substrate by photographic, screen printing or similar methods. The conductive portions of printed circuits formed by these methods are raised above the surface of the substrate. In some printed circuit applications, the raised conductive elements are not suitable and methods are known for forming inlaid printed circuits wherein the face of the circuit elements are flush with a surface of an insulating base usually plastic. Inlaid printed circuits are preferable in switching and commutating applications wherein it is desired to protect the conductors from erosion or cracking during repeated operations. The printed circuit is customarily formed on a flat substrate which is then mounted within the switching or commutating apparatus in which it is to be used. Subassemblies of this type generally add to the overall cost of the apparatus.

This invention is directed to providing a printed circuit directly on a molded plastic article of the electrical apparatus such as directly on the housing for such apparatus. Known photographic methods for depositing a printed circuit directly on the housing member are unsatisfactory when the location of the printed circuit is to be at the bottom of a recessed portion of the molded plastic article primarily because it is difficult to remove photoresist material from interior corners and sharp crevices. Screen printing requires a flat surface and is not suitable for use in recessed areas.

SUMMARY OF THE INVENTION

This invention provides an article and a method of making that article wherein a printed circuit is embedded within a recessed surface of the article and wherein the printed circuit may extend continuously over adjoining non-coplanar surfaces of the article. It provides a printed circuit formed on, and temporarily bonded to, a flexible backing which may be inserted within the die cavity of an injection mold, shaped to conform to adjoining non-coplanar surfaces of the mold which define the cavity and later be stripped from the molded article to leave the conductive printed circuit embedded flush in the respective surface or surfaces of the article.

BRIEF DESCRIPTION OF THE DRAWINGS

FIG. 8 is a schematic representation of the temporary backing and printed circuit of FIG. 2 shown in cross section disposed between two die halves of an injection mold;

FIG. 9 is a sequential view from that of FIG. 8 showing the temporary backing and printed circuit held in position against surfaces in one of the mold die halves and the two halves of the mold closed;

FIG. 10 is a sequential view from FIG. 9, drawn to an enlarged scale, showing plastic material injected into the cavity defined by the injection mold;

DESCRIPTION OF THE PREFERRED EMBODIMENT

Figure 1:
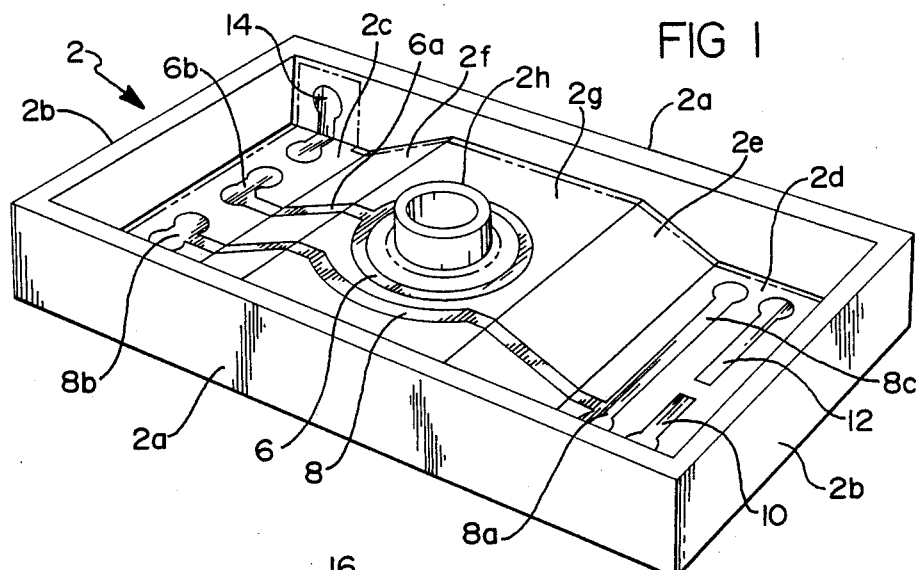
FIG. 1 is a perspective view of a molded plastic article having a printed circuit embedded in adjoining non-coplanar recessed surfaces thereof according to this invention.

An injection molded plastic article constructed of an exemplary configuration according to this invention is shown in FIG. 1. Such article may be a molded plastic housing element 2 of electrical apparatus having a rectangular box-like shape defined by side walls 2a and end walls 2b and an irregularly shaped bottom wall comprising end surfaces 2c and 2d, adjoining oblique surfaces 2e and 2f and a central surface 2g adjoining with each of the oblique surfaces 2e and 2f. A cylindrical boss 2h projects upwardly from the center of surface 2g. In the particular application of housing member 2, it is desired to have a printed circuit adjacent interior surfaces of the housing. Fabrication of a separate printed circuit board, stocking, storing and handling that board, assembling the same in position within housing 2, inspection of the board and its assembly and potential for improper assembly or breakage can all be eliminated by molding the printed circuit directly in housing 2, yielding significant cost savings. However, the design of housing 2 requires an irregular, multi-surface recessed interior where the printed circuit is to be located. By providing a flexible temporary backing for the printed circuit which can be shaped to conform to the surfaces within the mold cavity, a printed circuit can be provided in the recessed area.

Figure 2:
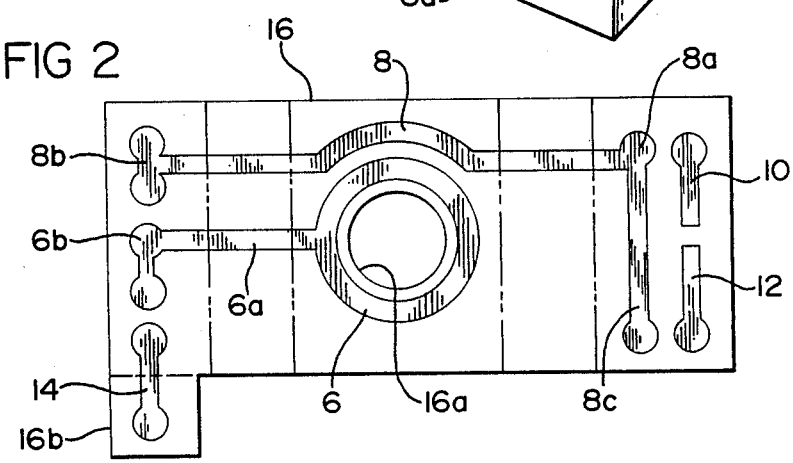
FIG. 2 is a plan view of a printed circuit and temporary backing, or carrier, for the circuit.
Figure 3:
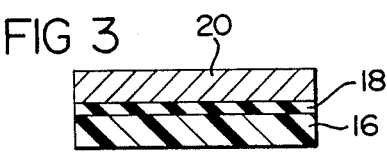
FIGS. 3 to 7 are cross sectioned schematic representations of sequential steps in forming the printed circuit on a temporary backing as shown in FIG. 2 and subsequently embedding the printed circuit in the molded plastic article such as shown in FIG. 1.

With reference to FIGS. 1 and 2, the particular printed circuit is merely exemplary to illustrate the invention. It comprises a circular trace 6 on center surface 2g formed concentric with boss 2h. A lead 6a extends from circular trace 6 centrally down oblique surface 2f to a pad 6b on end surface 2c. A second conductive trace comprises an arcuate section 8 concentric with circular trace 6 on center surface 2g. Straight line continuations extend from the opposite ends of segment 8 along oblique surfaces 2e and 2f to terminate as pads 8a on end surface 2d and 8b on end surface 2c. A trace 8c extends transversely from pad 8a along surface 2d. A pair of linearly spaced traces 10 and 12 extend parallel to trace 8c on surface 2d. A trace 14 is formed on end surface 2c and the adjacent interior surface of one side wall 2a, the trace 14 being continuous between these two surfaces.

To embed the printed circuit defined by the respective traces 6–14 in the plastic molded housing 2 during the molding process, the circuit is first formed on a flexible, temporary backing member 16 of high temperature withstandability. Referring to FIG. 2, backing member 16 is rectangularly shaped to conform substantially to the interior shape of housing 2. A hole 16a is provided in the center of backing 16 at the place where boss 2h will be formed. A tab 16b is provided at the lower left-hand corner as viewed in FIG. 2 on which a portion of trace 14 will be formed.

Referring to FIGS. 3-7, the steps of forming the flexible mold insert comprising temporary backing 16 and the printed circuit formed thereon will be described. The flexible, high temperature withstandability backing 16 is provided in flat profile as shown in FIG. 2. The material for backing 16 should be economically available inasmuch as it is an expendable, throw-away item in the process of molding housing part 2. A thin layer of adhesive 18 is applied to one surface of backing member 16. Next, a layer of electrically conductive material 20, such as copper, is deposited on the adhesive. Layer 20 may be rolled annealed copper of a thickness of 1.5 mil to permit the flexibility desired. Adhesive 18 may be a low strength adhesive to permit ready separation from backing 16 or from the conductive layer 20 or it may be of a type which is preferential to the backing 16, having a high bond strength to the backing and a lower bond strength to the copper conductive layer 20. By way of example, a plastic film tape comprising a polyimide film backing and silicone adhesive available from the Minnesota Mining and Manufacturing Company, St. Paul Minn., as part number 5413, is a suitable backing and adhesive to which the conductive material such as copper may be deposited.

Figure 4:
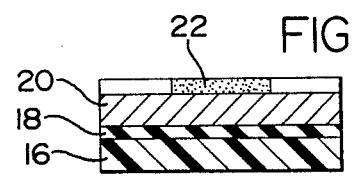
Figure 5:
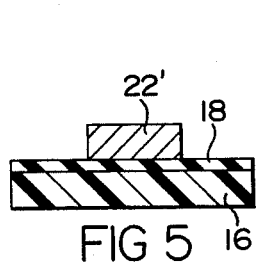
Figure 6:
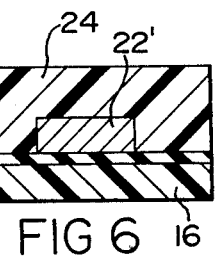
Figure 7:
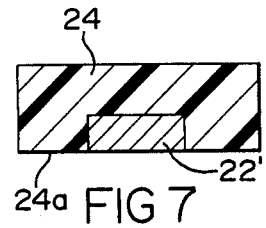

Next, the image of the conductive traces of the printed circuit is created on conductive layer 20, such as photographically by a photo-resist mask 22 as seen in FIG. 4. The non-imaged portion of conductive layer 20 is removed by well known and conventional photo-etch processes to leave the imaged printed circuit conductive trace 22' as shown in FIG. 5. In a manner to be described in more detail hereinafter, the resulting backing 16 with remaining printed circuit conductive traces 22' is positioned in an injection mold so that the backing 16 is held adjacent a surface of the mold which defines a cavity for receiving the plastic material, thereby exposing the printed circuit trace 22' to the cavity and to the injected plastic material. This is shown in FIG. 6, wherein the plastic material 24 surrounds three sides of the conductive trace 22'. When the plastic has cured and the molded article is removed from the mold, the backing 16 and adhesive 18 are stripped from the plastic article 24, leaving the printed circuit trace 22' embedded in and flush with surface 24a of the plastic article as seen in FIG. 7.

Referring to FIG. 8, the method of molding the housing 2 with the printed circuit embedded in the respective internal surfaces thereof will be described. In FIG. 8, a two part injection mold 26 is depicted in schematic form as comprising a lower die half 26a and an upper die half 26b. Lower die half 26a of mold 26 has a cavity 26c formed therein which defines housing part 2 and its irregular internal surfaces 2c-2g. The cavity 26c also comprises an annular recess 26d in which an upstanding pin 26e projects for forming the cylindrical boss 2h. Vacuum ports 26f communicate with the surface of cavity 26c at various intervals and are connected to a vacuum supply 28 for holding the backing member 16 against the surface of lower die half 26a within the cavity 26c. Backing member 16 is flexible and may be slightly preformed if desired (as shown in FIG. 8) or merely flexibly placed and worked against the surface of lower die half 26a to be held in place by the vacuum created by supply 28. When so positioned, the adhesive side 18 of backing member 16 and the respective printed circuit traces are disposed in the cavity 26c. The upper die half 26b is then closed upon the lower die half 26a as shown in FIG. 9, proper alignment being insured by corresponding engagement of holes 26g over locating pins 26h of lower die half 26a as shown in FIG. 9. The mating surface of upper die half 26b cooperates with the lower die half 26a to define the remaining surface of the cavity 26c.

Figure 11:
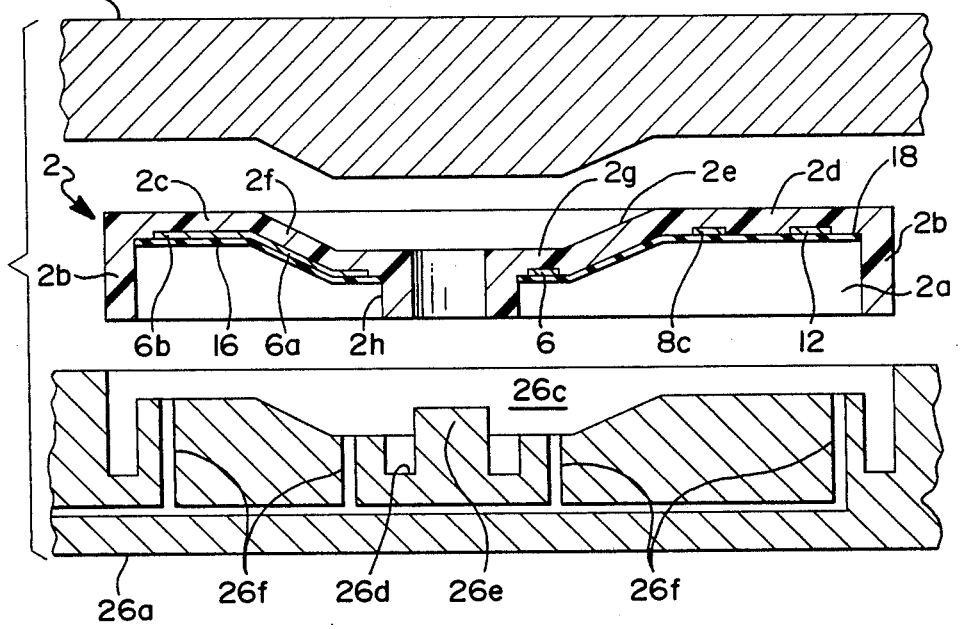
FIG. 11 is a sequential view from FIG. 10 showing the two die halves of the mold opened and the molded plastic article ejected therefrom.
Figure 12:
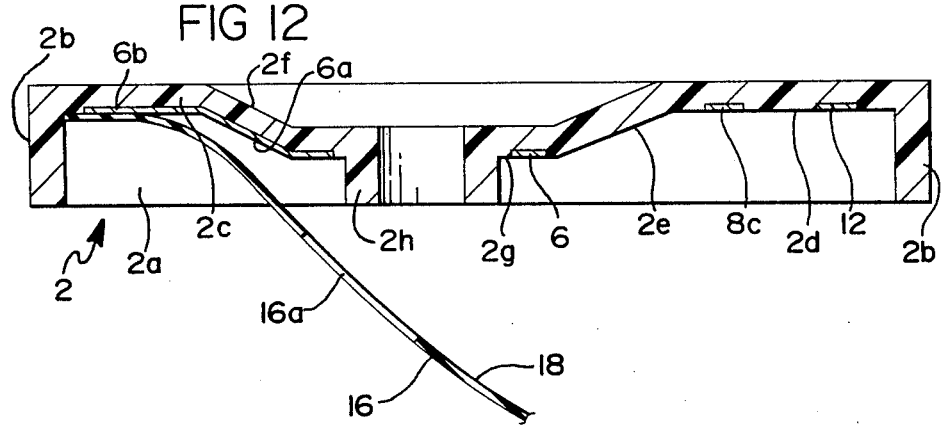
FIG. 12 is a sequential view from FIG. 11 showing the temporary backing being stripped from the molded plastic article and the printed circuit remaining embedded in the recessed surfaces of the article.

Referring next to FIG. 10 which is an enlarged view of the portion of mold 26 which defines cavity 26c, plastic material 24 is injected into the cavity 26c such that it surrounds the exposed three surfaces of each of the conductive traces of the printed circuit as it fills the cavity 26c. When the plastic material 24 has cured, the mold is opened by separating the upper and lower die halves 26a and 26b, respectively, and ejecting the molded plastic housing 2 from the mold as seen in FIG. 11. The printed circuit and temporary backing 16 adhere to the irregular interior recessed surfaces of housing 2 as it is separated from the mold. The temporary backing 16 and adhesive 18 are thereafter stripped from the irregular internal surface of housing part 2 as shown in FIG. 12, leaving the printed circuit traces embedded in and flush with the respective surfaces of housing part 2. If the adhesive 18 is of the low strength type, some adhesive may be left on the printed circuit traces or on the internal surfaces of housing part 2, in which case the adhesive residue may be removed by a suitable cleaning or etching process. The backing 16 and residue of adhesive 18 are disposable items to be discarded when removed from the housing part 2. The process readily and economically provides a printed circuit as an integral part of the housing 2 within an internal recess of the housing part. The article and its method of manufacture described herein are particularly well suited for molded plastic parts having deep recessed surfaces and irregular shaped recessed surfaces. It is to be understood that the molded article and the method of making such article described herein are susceptible to various modifications without departing from the scope of the appended claims.

What is claimed is:

1. A method of providing a molded plastic article having a continuous conductive printed circuit embedded in at least two adjoining non-coplanar recessed surfaces of said article with an exposed surface of said printed circuit substantially flush with said recessed surfaces in which it is embedded, comprising:

providing a flexible temporary backing member;

applying an adhesive coating to one surface of said backing member;

providing a conductive printed circuit on said adhesive coating providing an injection mold having a cavity defined by at least two adjoining non-coplanar cavity defining surfaces;

positioning and flexibly conforming said backing concurrently against each said adjoining non-coplanar cavity-defining surface of said injection mold with said conductive printed circuit disposed within said mold cavity defined by said surfaces, said printed circuit extending continuously from one said adjoining cavity-defining surface to another said adjoining cavity-defining surface;

injecting plastic into said mold cavity around three sides of said conductive printed circuit;

releasing said plastic from said mold as said molded plastic article with said conductive printed circuit embedded in said at least two adjoining non-coplanar recessed surfaces of said article and said backing affixed to said conductive printed circuit by said adhesive, said circuit being continuous between said adjoining non-coplanar surfaces; and peeling said backing and said adhesive from said conductive printed circuit, leaving a fourth side of said conductive printed circuit forming said exposed surface which is substantially flush with said article surfaces in which it is embedded.

2. The method of providing a molded plastic article defined in claim 1 wherein:

said adhesive is more adherent to said backing than to said conductive printed circuit; and said flexible backing and said adhesive are removed from said conductive printed circuit by stripping said backing from said article, said adhesive remaining with said backing.

3. The method of providing a molded plastic article defined in claim 2 wherein said flexible backing has a high temperature withstandability.

4. The molded plastic article defined in claim 3 wherein said at least one surface defining said cavity comprises at least a pair of non-coplanar adjoining surfaces and said temporary backing is flexible, said backing being held coextensively against said adjoining surfaces of said mold with said conductor disposed adjacent said cavity, and said conductor embedded if adjoining surfaces of said article formed by said adjoining surfaces of said mold being continuous between said adjoining surfaces of said article.

5. The method of providing a molded plastic article defined in claim 1 wherein providing said conductive printed circuit on said adhesive coating comprises:

depositing a layer of electrically conductive material on said adhesive coating;

providing a photo-resist image of said printed circuit on said layer of conductive material; and etching said conductive material to remove non-imaged conductive material.

* * * * *